United States Patent
Jang et al.

(10) Patent No.: US 9,456,497 B2
(45) Date of Patent: Sep. 27, 2016

(54) NANO GRAPHENE PLATELET-BASED CONDUCTIVE INKS AND PRINTING PROCESS

(75) Inventors: Bor Z. Jang, Centerville, OH (US); Aruna Zhamu, Centerville, OH (US)

(73) Assignee: Nanotek Instruments, Inc., Dayton, OH (US)

(*) Notice: Subject to any disclaimer, the term of this patent is extended or adjusted under 35 U.S.C. 154(b) by 152 days.

(21) Appl. No.: 13/184,787

(22) Filed: Jul. 18, 2011

(65) Prior Publication Data

US 2012/0007913 A1    Jan. 12, 2012

Related U.S. Application Data

(62) Division of application No. 12/215,813, filed on Jul. 1, 2008, now abandoned.

(51) Int. Cl.

| | |
|---|---|
| *C01B 31/02* | (2006.01) |
| *H05K 1/00* | (2006.01) |
| *H01B 1/24* | (2006.01) |
| *B82Y 30/00* | (2011.01) |
| *B82Y 40/00* | (2011.01) |
| *H05K 1/09* | (2006.01) |
| *C09D 11/037* | (2014.01) |

(Continued)

(52) U.S. Cl.
CPC .............. *H05K 1/097* (2013.01); *C09D 11/037* (2013.01); *C09D 11/38* (2013.01); *C09D 11/52* (2013.01); *H05K 2201/0245* (2013.01); *H05K 2201/0323* (2013.01)

(58) Field of Classification Search
CPC ....... B82Y 10/00; B82Y 20/00; B82Y 30/00; B82Y 40/00; H01B 1/00; H01B 1/24; H05K 1/097

USPC .............. 252/500–511; 3/502; 977/842, 887, 977/890; 257/40
See application file for complete search history.

(56) References Cited

U.S. PATENT DOCUMENTS

| | | |
|---|---|---|
| 2,798,878 A | 7/1957 | Hummers |
| 5,330,680 A | 7/1994 | Sakawaki et al. |

(Continued)

FOREIGN PATENT DOCUMENTS

WO    WO2007136643 A2 * 11/2007

OTHER PUBLICATIONS

Wong et al. ("Graphene Nanoplatelet Reinforced Polymer Coatings." ANTEC 2004 Plastics: Annual Technical Conference, vol. 2: Materials. p. 1733-1737, 2004).*
Viculis et al., "A Chemical Route to Carbon Nanoscrolls," *Science*, Feb. 28, 2003, 299, 5611; p. 1361.

(Continued)

*Primary Examiner* — Tri V Nguyen

(57) ABSTRACT

A nano graphene platelet-based conductive ink comprising: (a) nano graphene platelets (preferably un-oxidized or pristine graphene), and (b) a liquid medium in which the nano graphene platelets are dispersed, wherein the nano graphene platelets occupy a proportion of at least 0.001% by volume based on the total ink volume and a process using the same. The ink can also contain a binder or matrix material and/or a surfactant. The ink may further comprise other fillers, such as carbon nanotubes, carbon nano-fibers, metal nano particles, carbon black, conductive organic species, etc. The graphene platelets preferably have an average thickness no greater than 10 nm and more preferably no greater than 1 nm. These inks can be printed to form a range of electrically or thermally conductive components or printed electronic components.

19 Claims, 4 Drawing Sheets

(51) Int. Cl.
  *C09D 11/38* (2014.01)
  *C09D 11/52* (2014.01)

(56) References Cited

U.S. PATENT DOCUMENTS

| | | | |
|---|---|---|---|
| 6,596,396 | B2 | 7/2003 | Hirata et al. |
| 6,869,730 | B2 * | 3/2005 | Matsubara et al. ........... 429/217 |
| 6,872,330 | B2 | 3/2005 | Mack et al. |
| 7,071,258 | B1 | 7/2006 | Jang et al. |
| 7,097,788 | B2 | 8/2006 | Kirkor |
| 7,279,247 | B2 | 10/2007 | Matarredona et al. |
| 7,824,651 | B2 | 11/2010 | Zhamu et al. |
| 2002/0074932 | A1 * | 6/2002 | Bouchard et al. ............ 313/495 |
| 2004/0034151 | A1 * | 2/2004 | Kaschak et al. .............. 524/495 |
| 2004/0127621 | A1 * | 7/2004 | Drzal et al. ................... 524/424 |
| 2004/0131858 | A1 * | 7/2004 | Burden et al. ................ 428/408 |
| 2004/0247515 | A1 * | 12/2004 | Gardner ..................... 423/447.2 |
| 2005/0224764 | A1 * | 10/2005 | Ma ........................... C09D 5/24 252/500 |
| 2005/0250052 | A1 | 11/2005 | Nguyen |
| 2006/0241237 | A1 * | 10/2006 | Drzal et al. ................... 524/495 |
| 2006/0246276 | A1 * | 11/2006 | Chung ........................ 428/323 |
| 2007/0092432 | A1 * | 4/2007 | Prud'Homme et al. ...... 423/448 |
| 2007/0092716 | A1 * | 4/2007 | Guo et al. ..................... 428/323 |
| 2007/0131915 | A1 * | 6/2007 | Stankovich et al. .......... 252/511 |
| 2007/0142547 | A1 * | 6/2007 | Vaidya et al. ................ 524/847 |
| 2007/0158618 | A1 * | 7/2007 | Song et al. ................... 252/500 |
| 2007/0161163 | A1 | 7/2007 | Hirai |
| 2007/0212538 | A1 * | 9/2007 | Niu ............................... 428/367 |
| 2007/0284557 | A1 * | 12/2007 | Gruner et al. ................ 252/500 |
| 2007/0292622 | A1 * | 12/2007 | Rowley et al. ............ 427/407.1 |
| 2008/0048152 | A1 | 2/2008 | Jang et al. |
| 2008/0111110 | A1 | 5/2008 | Ma et al. |
| 2011/0052813 | A1 * | 3/2011 | Ho et al. ....................... 427/256 |

OTHER PUBLICATIONS

Novoselov, K.S., et al., "Electric field effect in atomically thin carbon films," *Science*, 306 (2004), pp. 666-669.
Lee, C. et al., "Measurement of Elastic Properties and Intrinsic Strength of Monolayer Graphene," *Science*, 321, Jul. 2008, pp. 385-388.
Balandin, A. et al., "Superior Thermal Conductivity of Single-Layer Graphene," *Nano Lett.*, 8 (3), 2008, pp. 902-907.
Geim, A.K. et al., "The rise of graphene," *Nature Materials*, 6 pp. 183-191 (2007).
Hobbie, E.K. et al., "Rheology of Concentrate Carbon Nanotube Suspensions," *The J. of Chem. Phys.*, 126 (2007) 124907 (7 pages).
Huang, Y.Y. et al., "Dispersion Rheology of Carbon Nanotubes in a Polymer Matrix," *Physical Review*, B 73 (2006) 125422 (9 pages).
Kinloch, I.A. et al., "A Rheological Study of Concentrated Aqueous Nanotube Dispersions," *Polymer*, 43 (2002) pp. 7483-7491.
Mustonen, T. et al., "Controlled Ohmic and Nonlinear Electrical Transport in Ink-printed Single-Wall Carbon Nanotube Films," *Physical Review*, B 77 (2008) 125430 (7 pages).
Mustonen, T. et al., "Inkjet Printing of Transparent and Cond, Patterns of Single-Walled Carbon Nanotubes and Pedot-Pss Composites," *Phys. Stat. Sol.*, (b) 244 (2007) pp. 4336-4340.
Rahatekar, S.S. et al., "Optical Microstructure and Viscosity Enhancement for an Eposy Resin Matrix Containing Multiwall Carbon Nanotubes," *J. Rheol.*, 50 (5) (2006) pp. 599-610.
Small, W.R. et al., "Inkjet Deposition and Charact. of Transparent Cond. Electroactive Polyaniline Comp. Films with a High CNT Loading," *J. Mater. Chem.*, 17 (2007) pp. 4359-4361.
Song, J.W. et al., "Inkjet Printing of Single-Walled Carbon Nanotubes and Electrical Characterization of the Line Pattern," *Nanotechnology*, 19 (2008) 095702 (6 pages).
Yu et al., "Graphite Nanoplatelet-Epoxy Composite Thermal Interface Materials," *J. Physical Chem.*, C 111 (2007) pp. 7565-7569.

\* cited by examiner

NANO GRAPHENE PLATELET-BASED CONDUCTIVE INKS AND PRINTING PROCESS

CROSS-REFERENCE TO RELATED APPLICATION

This application is a divisional application of U.S. application Ser. No. 12/215,813 filed Jul. 1, 2008, and claims benefit thereto.

FIELD OF THE INVENTION

The present invention relates generally to the field of conductive inks, and more particularly to nano graphene platelet-based inks that are electrically and thermally conductive and processes employing the same.

BACKGROUND OF THE INVENTION

Conductive inks, particularly carbon-based inks, have been widely used in the manufacture of conducting elements in printed circuits and sensor electrodes. Other major markets for conductive inks include emerging applications, such as displays, backplanes, radio frequency identification (RFID), photovoltaics, lighting, disposable electronics, and memory sensors, as well as traditional thick film applications in which screen printing is used in the creation of PCBs, automobile heaters, EMI shielding, and membrane switches. There is tremendous interest in the field of RFID and printed electronics. This is because major retailers and institutions need to be able to more accurately and efficiently track inventory, and RFID and printed electronics are considered the ideal solution.

Among various electrically conductive nano particles, silver is commonly considered the material of choice for RFID antennas; but, nano silver particles are very expensive. A carbon-based ink typically contains particles of graphite, amorphous carbon, or carbon black (CB) that are suspended in a binder/resin and a solvent. These inks are applied on a substrate surface via a number of deposition techniques, including brush painting, syringe application, inkjet printing, screen printing, and gas assisted spraying. The ink is allowed to dry and the resulting carbon-coated surface, if containing a binder or matrix resin, is subjected to a curing treatment. Further, printing RFID tags is seen as the most likely way to reduce their costs to a point where such tags can be widely used on cost sensitive items, such as food packages. Compared to micron-scaled particles, nano-scaled particles are more amenable to inkjet printing.

For printed electronics, all conventional carbon-based conductive particles have one or more shortcomings. For instance, graphite particles are too large in size to be inkjet printable; they easily clog up the dispensing nozzles. Carbon black is not sufficiently conducting and, hence, cannot be used alone as a conductive additive in an ink. Another class of carbon materials that can be inkjet printed is the carbon nano-tube (CNT) [Refs. 1-4]. CNTs, although relatively conducting, are prohibitively expensive. The production of CNTs necessarily involves the use of heavy metal elements as catalysts that are undesirable in many applications and must be removed. The CNTs that contain catalysts tend to undergo sedimentation in a dispersing liquid, which is a highly undesirable feature in a conductive ink. Further, CNTs tend to aggregate together and get entangled with one another due to their high length-to-diameter aspect ratio, making it difficult to disperse CNTs in water, organic solvents, and polymer matrices (for forming nanocomposites). The aggregation and entanglement of CNTs also dramatically increase the viscosity of the dispersing liquid [e.g., Refs. 5 and 6], to the extent that inkjet printing of CNT inks is possible only when an exceedingly low CNT concentration is involved. Similarly, processing of CNT-resin nanocomposite is not possible with melt mixing/molding (e.g., via extrusion or injection molding) when CNT loading exceeds 5% by weight [Refs. 7 and 8].

Therefore, there is a need for nano particle-containing conductive inks that exhibit the following features: (1) the conductive additives are much less expensive than CNTs; (2) the inks are printable, preferably inkjet printable using a conventional, low-cost printhead; (3) the additives and the resulting printed elements are highly conductive, electrically and/or thermally; (4) the additives can be readily dispersed in a wide range of liquid mediums and do not form a sediment; and (5) the inks can contain a high conductive additive content so that a desired amount or thickness of conductive elements can be dispensed and deposited onto a substrate in one pass or few passes (to avoid or reduce the need for repeated printing passes or overwrites). It is of interest to note that high thermal conductivity is a desirable feature of an additive for microelectronic packaging applications since modern microelectronic devices, when in operation, are generating heat at an ever increasing rate. An additive with a high thermal conductivity provides a more efficient thermal management material.

REFERENCES CITED

The following is a list of references that are related to the prior art:

1. J. W. Song, "Inkjet Printing of Single-Walled Carbon Nanotubes and Electrical Characterization of the Line Pattern," Nanotechnology, 19 (2008) 095702 (6 pp).
2. T. Mustonen, et al., "Inkjet Printing of Transparent and Conductive Patterns of Single-Walled Carbon Nanotubes and PEDOT-PSS Composites," Phys. Stat. Sol. (b) 244 (2007) 4336-4340.
3. W. R. Small, et al., "Inkjet Deposition and Characterization of Transparent Conducting Electroactive Polyaniline Composite Films with a High Carbon Nanotube Loading Fraction," J. Materials Chem., 17 (2007) 43594361.
4. T. Mustonen, et al., "Controlled Ohmic and Nonlinear Electrical Transport in Ink-printed Single-Wall Carbon Nanotube Films," Physical Review, B 77 (2008) 125430 (7 pp).
5. E. K. Hobbie and D. J. Fry, "Rheology of Concentrated Carbon Nanotube Suspensions," The J. of Chem. Phys., 126 (2007) 124907 (7 pp).
6. I. A. Kinloch, S. A. Roberts, and A. H. Windle, "A Rheological Study of Concentrated Aqueous Nanotube Dispersions," Polymer, 43 (2002) 7483-7491.
7. S. S. Rahatekar, et al., "Optical Microstructure and Viscosity Enhancement for an Epoxy Resin Matrix Containing Multiwall Carbon Nanotubes," J. Rheol. 50 (5) (2006) 599-610.
8. Y. Y. Huang, et al., "Dispersion Rheology of Carbon Nanotubes in a Polymer Matrix," Physical Review, B 73 (2006) 125422 (9 pp).
9. E. S. Kirkor, "Conducting Inks," U.S. Pat. No. 7,097,788 (Aug. 29, 2006).
10. O. Matarredona, et al., "Carbon Nanotune Pastes and Method of Use," U.S. Pat. No. 7,279,247 (Oct. 9, 2007).
11. J. J. Mack, et al., "Chemical Manufacture of Nanostructured Materials," U.S. Pat. No. 6,872,330 (Mar. 29, 2005).

12. M. Hirata and S. Horiuchi, "Thin-Film-Like Particles Having Skeleton Constructed by Carbons and Isolated Films," U.S. Pat. No. 6,596,396 (Jul. 22, 2003).
13. Bor Z. Jang, Aruna Zhamu, and Jiusheng Guo, "Process for Producing Nano-scaled Platelets and Nanocomposites," U.S. patent pending, Ser. No. 11/509,424 (Aug. 25, 2006).
14. Bor Z. Jang, Aruna Zhamu, and Jiusheng Guo, "Mass Production of Nano-scaled Platelets and Products," U.S. patent pending, Ser. No. 11/526,489 (Sep. 26, 2006).
15. B. Z. Jang and W. C. Huang, "Nano-scaled Graphene Plates," U.S. Pat. No. 7,071,258 (Jul. 4, 2006).
16. Aruna Zhamu, Jinjun Shi, Jiusheng Guo and Bor Z. Jang, "Method of Producing Exfoliated Graphite, Flexible Graphite, and Nano-Scaled Graphene Plates," U.S. patent pending, Ser. No. 11/800,728 (May 8, 2007).
17. A. Yu, et al., "Graphite Nanoplatelet-Epoxy Composite Thermal Interface Materials," J. Physical Chem., C 111 (2007) 7565-7569.

SUMMARY OF THE INVENTION

The present invention provides a nano graphene platelet-based conductive ink comprising: (a) nano graphene platelets (NGPs) wherein each of the platelets comprises a graphene sheet or multiple graphene sheets and the platelets have a thickness no greater than 100 nm, and (b) a liquid medium in which the NGPs are dispersed, wherein the NGPs occupy a proportion of at least 0.001% by volume based on the total ink volume. A manifestation of the invention is a process for printing an electrically or thermally conductive component or pattern or a printed electronic component, and more particularly a process for printing an electrically or thermally conductive component or pattern by brush painting, syringe application, inkjet printing, screen printing, and gas assisted spraying component; but more particularly by ink jet printing.

An NGP is essentially composed of a sheet of graphene plane or multiple sheets of graphene plane stacked and bonded together. Each graphene plane, also referred to as a graphene sheet or basal plane, comprises a two-dimensional hexagonal structure of carbon atoms. Each platelet has a length and a width parallel to the graphite plane and a thickness orthogonal to the graphite plane. In an NGP, the largest dimension is defined as the length, the smallest dimension as the thickness, and the third or intermediate dimension as the width. By definition, the thickness of an NGP is 100 nanometers (nm) or smaller, with a single-sheet NGP being as thin as 0.34 nm. The length and width of a NGP are typically between 1 µm and 20 µm, but could be longer or shorter. Several methods have been developed for the production of NGPs [e.g., Refs. 11-15].

The graphene platelets preferably occupy a proportion of at least 1% by volume (for inkjet printability) and up to 40% by volume (for use in screen printing or other dispensing methods) based on the total ink volume. We have surprisingly observed that up to 60% by volume of NGPs can be easily incorporated into a liquid medium, such as water and ethanol, as opposed to the commonly recognized notion that carbon nanotubes (CNTS) can only be properly dispersed in a liquid for less than 10% by volume.

The presently invented conductive ink is preferably inkjet printable since inkjet printing is a cost-effective way to achieve patterns of various materials on both rigid and flexible substrates. Inkjet printing of electrically conductive nano particle-based inks offer a very practical platform for generating electrical components, such as electrodes and interconnects. More preferably, inkjet printing is conducted using a conventional, inexpensive printhead in a common desk-top printer. This type of printer typically requires the viscosity of the ink to be in the range of 3-30 mPaS (centi-poise or cP). It is of significance to note that the viscosity of a CNT-based ink can not be in this useful range unless the CNT proportion is exceedingly low. For instance, the CNT concentration of the ink used by Song, et al. [Ref. 1] was as low as 20 µg/mL (approximately 0.002% by weight of CNTs in water). With such a low concentration, it would take several repeated printing passes (overwrites) to achieve a desired CNT amount, thickness, or property; e.g., it took 8 overwrites to achieve a sheet resistivity of 20 µΩm [FIG. 5 in Ref 1]. By contrast, with the presently invented NGP-based ink that can carry a high NGP proportion, yet still maintaining a relatively low viscosity, one or two printing passes are sufficient to attain the same desired properties achieved with 5-20 overwrites using CNT-based inks. This implies that the printing speed of NGP-based inks would be much higher. This is on top of the fact that CNTs are extremely expensive.

Currently, certain type of specialty printer can print an ink with a solution viscosity up to 150 mPaS and some experimental printers that are still under development can work with a viscosity up to 500 mPaS. Even with these high-viscosity printers one would still find it difficult, if not impossible, to print CNT-based inks with a CNT content greater than 0.2% by weight since their viscosity will be greater than 1 PaS or 1,000 mPaS. This is not the case with NGP-based inks, which usually exhibit a much lower viscosity compared to their CNT counterparts (with comparable additive weight or volume fractions), to be illustrated later with examples.

Preferably, the graphene platelets have an average thickness less than 10 nm and more preferably no greater than 1 nm. Preferably, the conductive ink further comprises a surfactant (or dispersing agent) and/or a binder or matrix material. The binder or matrix material may be selected from a thermoplastic, a thermoset resin, a conductive organic substance, a petroleum or coal tar pitch, or a combination thereof.

The conductive ink may further comprise CNTs in an amount of less than 5% (further preferably less than 1%) by volume based on the total conductive ink volume. In addition to CNTs, several other types of conductive additives may be used to modify the properties of the conductive ink. Hence, in one preferred embodiment, the conductive ink may further comprise a conductive additive selected from the group consisting of carbon nanotubes, carbon nano-fibers, carbon black, fine graphite particles, nano-scaled metal particles, and combinations thereof.

As indicated earlier, for inkjet printing, the conductive ink should have a viscosity less than 500 mPaS (<0.5 PaS). For the conductive inks intended to be screen printed or spray deposited, a much higher viscosity is acceptable. Surprisingly, the ink may contain 20% by volume or higher of nano graphene platelets yet still exhibiting a low-shear viscosity value less than 200 PaS. This can not be attained with CNT-based inks.

Another preferred embodiment of the present invention is a conductive ink composition that, after printing onto a solid substrate to form a solid component, provides a thermal conductivity of at least 10 W/(mK), preferably at least 100 W/(mK), and most preferably at least 200 W/(mK); these are higher than thus far the highest conductivity values for CNT- or NGP-based polymer composites.

DETAILED DESCRIPTION OF PREFERRED EMBODIMENTS

Figure 1:
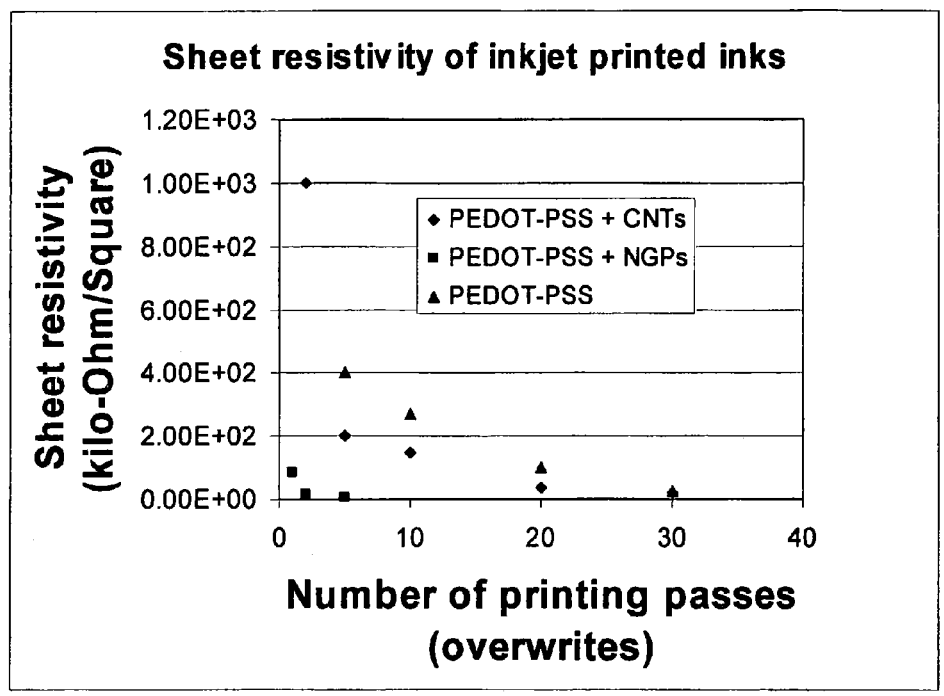
FIG. 1: Resistivity of various printed patterns from NGP- and CNT-based inks as a function of the number of printing passes.

Since the discovery of single-walled carbon nanotubes (SWNTs) and multi-walled carbon tubes (MWNTs), a large number of potential commercial applications have emerged, including polymeric composites, field emission displays, electrical capacitors, and thermal management materials. Although a number of different techniques have been proposed to manufacture CNT-based materials, the current demand of these materials is still limited due to several factors: First, the high cost of CNTs at this stage of production has discouraged a wider scope of application. Second, the difficulties in handling and dispersing CNTs make their incorporation in useful matrices a challenge. The incompatibility of CNTs with most typical solvents limits their effective handling and widespread use, since, when placed in water or most organic solvents, nanotubes generally quickly fall out of suspension even after strong sonication. Third, while only a very small amount of CNTs may be sufficient to achieve greatly improved properties in some applications, the concentration CNTs used may need to be much higher in other applications. All these three factors have a strong, negative impact on the applications of CNTs in conductive inks.

Rather than trying to develop much lower-cost processes for CNTs, we have worked diligently to develop alternative nano-scaled carbon materials that exhibit comparable properties, but can be produced in larger quantities and at much lower costs. This development work has led to the discovery of processes for producing individual nano-scaled graphite planes (individual graphene sheets) and stacks of multiple nano-scaled graphene sheets, which are collectively called "nano graphene plates (NGPs)." The structures of NGPs may be best visualized by making a longitudinal scission on the single-wall or multi-wall of a nano-tube along its tube axis direction and then flattening up the resulting sheet or plate. NGPs have become much lower-cost substitutes for carbon nano-tubes or other types of nano-rods for various scientific and engineering applications. The electronic, thermal and mechanical properties of NGP materials have been shown to be comparable or superior to those of carbon nano-tubes.

Direct synthesis of the NGP material had not been possible, although the material had been conceptually conceived and theoretically predicted to be capable of exhibiting many novel and useful properties. Jang and Huang provided an indirect synthesis approach for preparing NGPs and related materials [Ref. 15]. In most of the methods for making separated graphene platelets, the process begins with intercalating lamellar graphite flake particles with an expandable intercalation agent (intercalant), followed by thermally expanding the intercalant to exfoliate the flake particles. In some methods, the exfoliated graphite is then subjected to air milling, ball milling, or ultrasonication for further flake separation and size reduction. The NGPs prepared by using these methods are graphite oxide platelets since intercalation typically involves heavy oxidation of the flake graphite particles. Thermal and electrical conductivities of these oxidized NGPs or graphite oxide platelets are not as high as those of pristine, non-oxidized NGPs, which can be prepared by a direct ultrasonication method without exposing graphite to intercalation or oxidation [Ref. 16]. It is of significance to note that graphite is usually considered a hydrophobic material and can not be dispersed in a polar liquid such as water. Much to our surprise, direct ultasonication-produced NGPs, albeit being pristine, non-oxidized and non-polar graphene layers, are readily dispersable in water and many other organic solvents, in which NGPs were produced originally.

The presently invented conductive inks can contain oxidized or non-oxidized graphene platelets to meet the property requirements of intended applications. The preparation of these two types of NGPs and their inks are further discussed as follows:

Using graphite as an example, the first step for the preparation of pristine NGPs may involve preparing a laminar material powder containing fine graphite particulates (granules) or flakes, short segments of carbon fiber or graphite fiber, carbon or graphite whiskers, carbon or graphitic nano-fibers, or their mixtures. The length and/or diameter of these graphite particles are preferably less than 0.2 mm (200 μm), further preferably less than 0.01 mm (10 μm). They can be smaller than 1 μm. The graphite particles are known to typically contain micron- and/or nanometer-scaled graphite crystallites with each crystallite being composed of multiple sheets of graphite plane.

The second step comprises dispersing laminar materials (e.g., graphite or graphite oxide particles) in a liquid medium (e.g., water, alcohol, or acetone) to obtain a suspension or slurry with the particles being suspended in the liquid medium. The third step entails subjecting the suspension to direct ultrasonication at a temperature typically between 0° C. and 100° C. Hence, this method obviates the need or possibility to expose the graphite material to a high-temperature, oxidizing environment. Preferably, a dispersing agent or surfactant is used to help uniformly disperse particles in the liquid medium. Most importantly, we have surprisingly found that the dispersing agent or surfactant facilitates the exfoliation and separation of the laminar graphite material. Under comparable processing conditions, a graphite sample containing a surfactant usually results in much thinner platelets compared to a sample containing no surfactant. It also takes a shorter length of time for a surfactant-containing suspension to achieve a desired platelet dimension.

Surfactants or dispersing agents that can be used include anionic surfactants, non-ionic surfactants, cationic surfactants, amphoteric surfactants, silicone surfactants, fluoro-surfactants, and polymeric surfactants. Particularly useful surfactants for practicing the present invention include DuPont's Zonyl series that entails anionic, cationic, non-ionic, and fluoro-based species. Other useful dispersing agents include sodium hexametaphosphate, sodium ligno-sulphonate (e.g., marketed under the trade names Vanisperse CB and Marasperse CBOS-4 from Borregaard LignoTech), sodium sulfate, sodium phosphate, sodium sulfonate, sodium dodecylsulfate, sodium dodecylbezenesulfonate, and TRITON-X.

Ultrasonic or shearing energy also enables the resulting platelets to be well dispersed in the very liquid medium, producing a homogeneous suspension. One major advantage of this approach is that exfoliation, separation, and dispersion are achieved in a single step. A monomer, oligomer, or polymer may be added to this suspension to form a suspension that is a precursor to a nanocomposite structure.

Oxidized NGPs or graphite oxide platelets may be obtained by intercalation and exfoliation of graphite. Intercalation of graphite to form a graphite intercalation compound (GIC) is well-known in the art. A wide range of intercalants have been used; e.g., (a) a solution of sulfuric acid or sulfuric-phosphoric acid mixture, and an oxidizing agent such as hydrogen peroxide and nitric acid and (b) mixtures of sulfuric acid, nitric acid, and manganese permanganate at various proportions. Typical intercalation times are between one hour and five days. The resulting acid-intercalated graphite may be subjected to repeated washing and neutralizing steps to produce a laminar compound that is essentially graphite oxide. In other words, graphite oxide can be readily produced from acid intercalation of graphite flakes.

Conventional exfoliation processes for producing graphite worms (interconnected networks of thin graphite flakes) from a graphite material normally include exposing a graphite intercalation compound (GIC) or oxidized graphite to a high temperature environment, most typically between 850 and 1,050° C. These high temperatures were utilized with the purpose of maximizing the expansion of graphite crystallites along the c-axis direction. In some cases, separated NGPs are readily obtained with this treatment, particularly when the graphite has been heavily oxidized. In other cases, the exfoliated product may be subjected to a subsequent mechanical shearing treatment, such as ball milling, air milling, rotating-blade shearing, or ultrasonication. With this treatment, either individual oxidized graphene planes (one-layer NGPs) or stacks of oxidized graphene planes bonded together (multi-layer NGPs) are further reduced in thickness (for multi-layer NGPs), width, and length. In addition to the thickness dimension being nano-scaled, both the length and width of these NGPs could be reduced to smaller than 100 nm in size if so desired. In the thickness direction (or c-axis direction normal to the graphene plane), there may be a small number of graphene planes that are still bonded together through the van der Waal's forces that commonly hold the basal planes together in natural graphite. Typically, there are less than 30 layers (often less than 5 layers) of graphene planes, each with length and width from smaller than 1 µm to 100 µm. We observed that high-energy planetary ball mills and rotating blade shearing devices (e.g., Cowles) were particularly effective in producing nano-scaled graphene plates. Since ball milling and rotating-blade shearing are considered as mass production processes, the present method is capable of producing large quantities of NGP materials cost-effectively. This is in sharp contrast to the production and purification processes of carbon nanotubes, which are slow and expensive.

The oxidized NGPs prepared with a rotating blade device or ultrasonicator are already dispersed in a liquid, such as water, acetone, alcohol, or other organic solvent. They can be directly used as an ink or, in some cases, subjected to a further formulation procedure; e.g., removing some of the water or solvent, adding some more liquid or other ingredient (e.g., a binder or matrix resin).

It may be noted that the intercalation treatment using concentrated sulfuric-nitric mixtures have intrinsically introduced many useful functional groups to the edges and surfaces of graphene layers. These groups, such as hydroxyl and carbonyl, facilitate dispersion of oxidized NGPs in a polar liquid, such as water and alcohol for the production of conductive inks.

After extensive studies on NGP-solvent interactions, we have observed that NGPs could be dissolved in chloroform, benzene, toluene or other organic solvents after oxidation and subsequent derivatization with thionylchloride and octadecylamine. Partially oxidized NGPs may also undergo reactions with fluorine, alkanes, diazonium salts, or ionic functionalization. Alternatively, we could attach soluble polymers to NGPs by various methods. For example, we could develop non-covalent association of NGPs with linear polymers such as polyvinyl pyrrolidone and polystyrene sulfonate. The intimate interaction that occurs between the polymer and the NGPs results in an increased dispersability of the graphene platelets in water.

The following examples serve to illustrate the best mode practice of the present invention and should not be construed as limiting the scope of the invention:

EXAMPLE 1

Nano-Scaled Graphene Platelets (NGPs) from Natural Graphite Flakes

A typical procedure for preparing non-oxidized NGP-based conductive inks is described as follows: Five grams of graphite flakes, ground to approximately 10 µm or less in sizes, were dispersed in 1,000 mL of deionized water (containing 0.1% by weight of a dispersing agent, Zonyl® FSO surfactant from DuPont) to obtain a suspension. An ultrasonic energy level of 95 W (Branson S450 Ultrasonicator) was used for exfoliation, separation, and size reduction for different periods of time: 0.5, 1, 2, and 3 hours. The average thickness of the NGPs prepared was found to be 33 nm, 7.4 nm, 1 nm, and 0.89 nm, respectively.

For ink viscosity studies, the NGPs used were those with an average thickness of 7.4 nm. The water content of an ink sample was adjusted by using controlled evaporation (to increase NGP volume fraction in a suspension) or adding water (to dilute it). Suspensions with a range of NGP volume fractions, up to greater than 45%, were prepared. Much thinner NGPs (1 nm) were used for electrical resistivity and thermal conductivity measurements.

EXAMPLE 2

Nano-Scaled Graphene Platelets (NGPs) from Natural Graphite Flakes (No Dispersing Agent)

Five grams of graphite flakes, ground to approximately 10 µm or less in sizes, were dispersed in 1,000 mL of deionized water to obtain a suspension. An ultrasonic energy level of 95 W (Branson S450 Ultrasonicator) was used for exfoliation, separation, and size reduction for a period of 2.5 hours. The resulting NGPs, although thicker than those prepared with the assistance of a surfactant, were also well dispersed in water, forming a surfactant-free ink.

EXAMPLE 3

Preparation of Inks Containing Oxidized NGPs (Graphite Oxide Platelets)

Graphite oxide was prepared by oxidation of graphite flakes with sulfuric acid, nitrate, and potassium permanganate, at a ratio of 4:1:0.01 at 30° C., according to the method of Hummers [U.S. Pat. No. 2,798,878, Jul. 9, 1957]. Upon completion of the reaction, the mixture was poured into deionized water and filtered. The sample was then washed with 5% HCl solution to remove most of the sulfate ions and residual salt and then repeatedly rinsed with deionized water until the pH of the filtrate was approximately 7. The intent was to remove all sulfuric and nitric acid residue out of graphite interstices. The slurry was spray-dried and stored in a vacuum oven at 60° C. for 24 hours. The interlayer spacing of the resulting laminar graphite oxide was determined by the Debye-Scherrer X-ray technique to be approximately 0.73 nm (7.3 Å), indicating that graphite has been converted into graphite oxide. Graphite oxide was placed in a quartz tube, which was then inserted into a three-zone tube furnace pre-set at 1,050° C. and maintained at this temperature for 60 seconds. Nitrogen was continuously introduced into the quartz tube while graphite oxide was exfoliated. The resulting graphite oxide worms were then mixed with water and subjected to a shearing treatment using a rotating-blade device (Cowles) for 30 minutes. This procedure led to the formation of oxidized NGP dispersion or ink.

EXAMPLE 4

Preparation of CNT-Based Inks (with or without a Polymer Binder)

Conductive polymer poly(3,4-ethylenedioxythiophene)-poly(styrene sulfonate) (PEDOT-PSS) and carboxyl functionalized single-walled carbon nanotubes (SWCNT-COOHs) were also used in the present study.

SWCNT-COOHs were purchased from Sigma-Aldrich (CNT content 90%, carboxylic acid composition 3-6 at %, bundle dimensions 4-5 nm.x.0.5-1.5 μm). First, as a typical procedure, 2.5 mg of SWCNT-COOHs were dispersed in 20 ml ethanol by ultrasonic agitation for 20 min. Subsequently, the solution was centrifuged at 3500 rpm for 10 min, and the supernatant solution was separated and centrifuged again. The centrifugation procedure was repeated until a stable dark brown solution was achieved. The concentration of SWCNT-COOHs in ethanol was found to be approximately 0.1 g/l, corresponding to slightly less than 0.005% by volume. Ethanol evaporation was used to adjust the CNT volume fraction. A range of aqueous/ethanol CNT dispersions were prepared for viscosity and conductivity measurements.

PEDOT-PSS (1.3 wt % in water) was purchased from Sigma-Aldrich and diluted with DI water (polymer solution to DI water ratio of 6:4) to prepare the stock solution. The ink was made by mixing 8 ml SWCNT-COOH solution (with a CNT concentration of 0.1 g/l) and 2 ml polymer stock solution with vigorous stirring. A reference polymer ink solution was made by adding 2 ml of polymer stock solution to 8 ml of ethanol. Similarly, a reference SWCNT-COOH solution was made by mixing 2 ml of DI water to 8 ml of SWCNT-COOH solution in ethanol.

For comparison, the inks containing NGPs prepared in Example 1 and inks containing oxidized NGPs prepared in Example 3 were also inkjet printed. In one case, NGP solution was mixed with PEDOT-PSS to form an ink. Both CNT- and NGP-based inks were adjusted to the maximum concentration, with a zero-shear viscosity of approximately 100 mPaS.

The printed patterns were made on high gloss photo paper using an inkjet printer (Fast T-Jet Blazer TJB-1650 Printer from US Screen Print & Inkjet Technology with an Epson Pro 4800 Printhead) equipped with a cleaned and re-filled cartridge. The printed patterns on photo papers were lines with length and width of 40 mm and 2.5 mm, respectively. For electrical resistivity measurements using the 4-point probe method, Pt-electrodes (2.0×4.0 mm$^2$) having an average thickness of ~30 nm were sputtered on the printouts with a constant gap spacing of 10.0 mm. The electrical measurements were carried out using a voltmeter and a source meter (Keithley 2182A Nanovoltmeter and Keithley 2400 Sourcemeter). The structure of the printouts was characterized by scanning electron microscopy and transmission electron microscopy.

The resistivity data of printed patterns are summarized in Table 1 and FIG. 1

TABLE 1

Resistivity of various printed patterns as a function of the number of printing passes.

| No. Prints | PEDOT-PSS + CNT | CNT | PEDOT-PSS | NGPs | PEDOT-PSS + NGP | Oxidized NGPs |
|---|---|---|---|---|---|---|
| 1 | | | | 7.5E01 | 8.50E+01 | 8.70E+02 |
| 2 | 1.00E+03 | | | 1.10E01 | 1.60E+01 | 1.30E+02 |
| 5 | 2.00E+02 | | 4.00E+02 | 1.50E00 | 3.60E+00 | 7.20E+01 |
| 10 | 1.50E+02 | 2.00E+03 | 2.70E+02 | | | |
| 20 | 3.50E+01 | 4.20E+02 | 1.00E+02 | | | |
| 30 | 2.00E+01 | 1.50E+02 | 2.60E+01 | | | |

It is clear from Table 1 and FIG. 1 that, with CNT-based inks, the resistivity of printed patterns was still as high as 2,000 kgΩ/square even after 10 repeated overwrites and 150 kΩ/square after 30 repeated printing passes. By contrast, NGPs provide a low resistivity of 75 kΩ/square in one print. With some conducting polymer (PEDOT-PSS), the NGP-containing printed patterns also exhibit a relatively low resistivity after just a few repeated printing passes. Further, it is clear that the oxidized NGPs are less conductive than un-oxidized NGPs.

Figure 2:
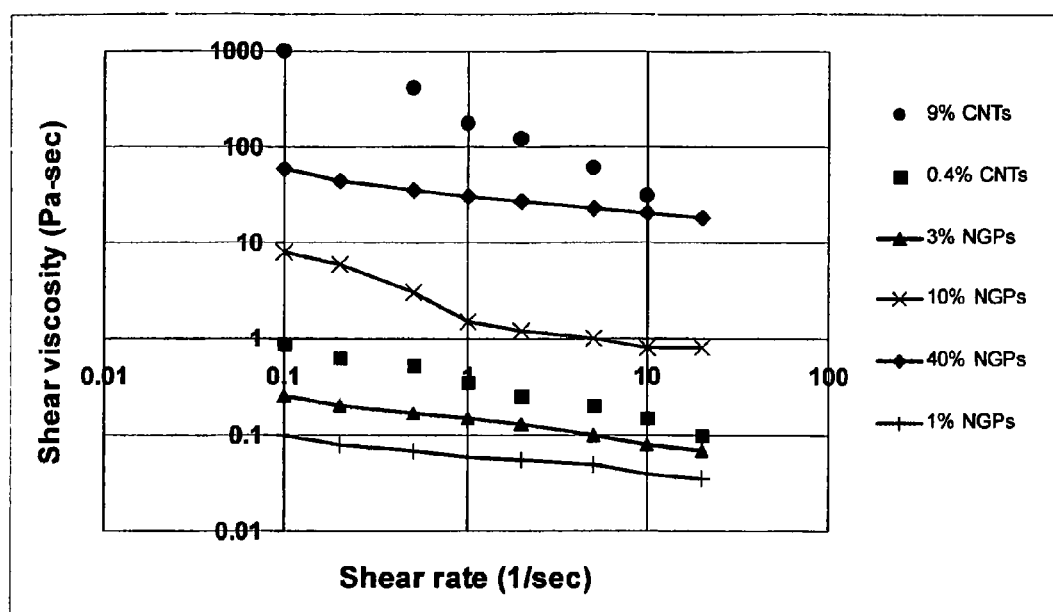
FIG. 2: The viscosity of several NGP- and CNT-containing aqueous dispersions or inks over a range of shear rates.
Figure 3:
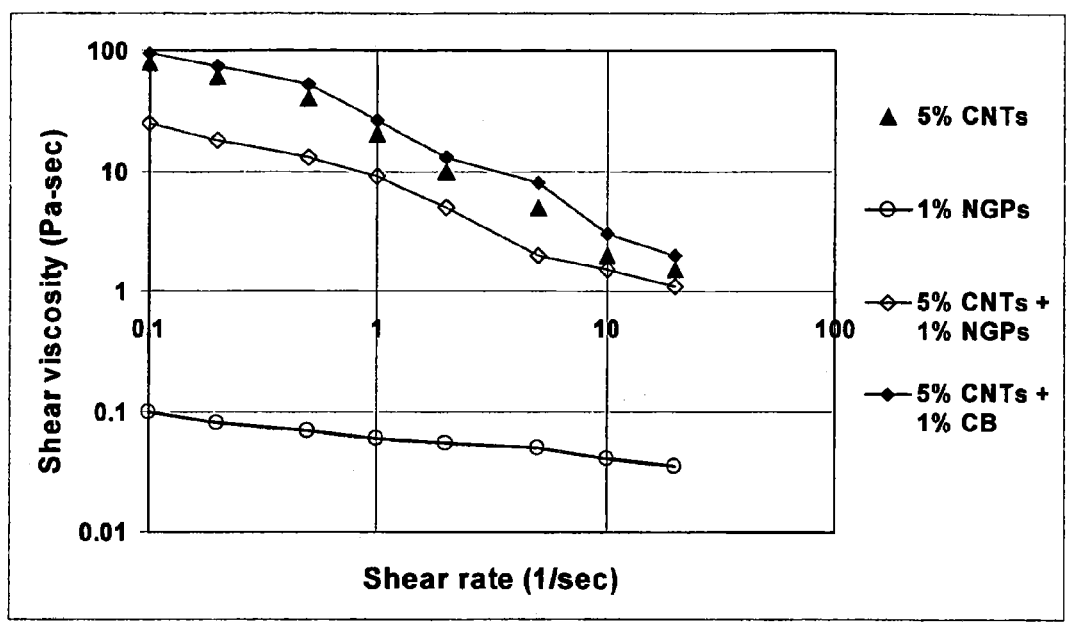
FIG. 3: The viscosity of several inks containing NGP, CNT, CNT+NGP, and CNT+CB as conductive nano fillers.

The viscosity of NGP- and CNT-containing aqueous dispersions was also investigated and the data are summarized in FIG. 2 and FIG. 3. FIG. 2 indicates that the viscosity of NGP-based inks is typically orders of magnitude lower than that of CNT-based ink with a comparable filler volume fraction. The viscosities of the inks containing 1% and 3% NGPs are much lower than the viscosity of the ink containing 0.4% CNTs. With an NGP content as high as 40%, the NGP-based ink exhibits a viscosity much lower than that of an ink containing 9% CNTs. These are very surprising results considering the fact that NGPs and CNTs are basically identical in chemical compositions (all graphene-based), only the geometry being different—sheet versus tube structures.

It is also highly surprising to observe that, by incorporating a small amount of NGPs in a CNT-based ink, one can significantly reduce the viscosity of the CNT ink. This is illustrated in FIG. 3, which demonstrates that an ink containing 5% CNTs and 1% NGPs (totally 6% nano filers) actually has a lower viscosity compared to an ink containing 5% CNTs only. Both samples were prepared under comparable ultrasonication conditions. Presumably, NGPs, being two-dimensional sheets with a nano-scaled third dimension, are capable of alleviating or reducing the tendency for CNTs to form aggregates and entanglements. This is an important observation by itself since this feature enables a greater amount of CNTs to be incorporated in a matrix material, significantly broadening the scope of CNT nanocomposite applications. In contrast, as also shown in FIG. 3, an additional 1% of carbon black (CB) particles actually slightly increase the viscosity of the CNT-ink.

It may be noted that an ink containing more than 40% by volume of NGPs, albeit exhibiting a relatively low viscosity, is still somewhat beyond the suitable viscosity range of current inkjet printers. However, these high-loading NGP-based inks can still be easily screen printed for microelectronic device applications, or spray-coated (e.g., using a compressed air gun) for coating applications. Hence, the NGP-based inks also have a utility value as coating materials that provide desired electrical and thermal conductivity.

Other types of fillers, other than CNTs or in combination with CNTs, can be added to NGP-based inks to modify their properties. These include carbon black, metal nano particles, conductive organic species, carbon nano-fibers, etc. These conductive fillers are well-known in the art.

EXAMPLE 5

Preparation of NGP- and CNT-Based Inks (with a Polymer Matrix Material)

Figure 4:
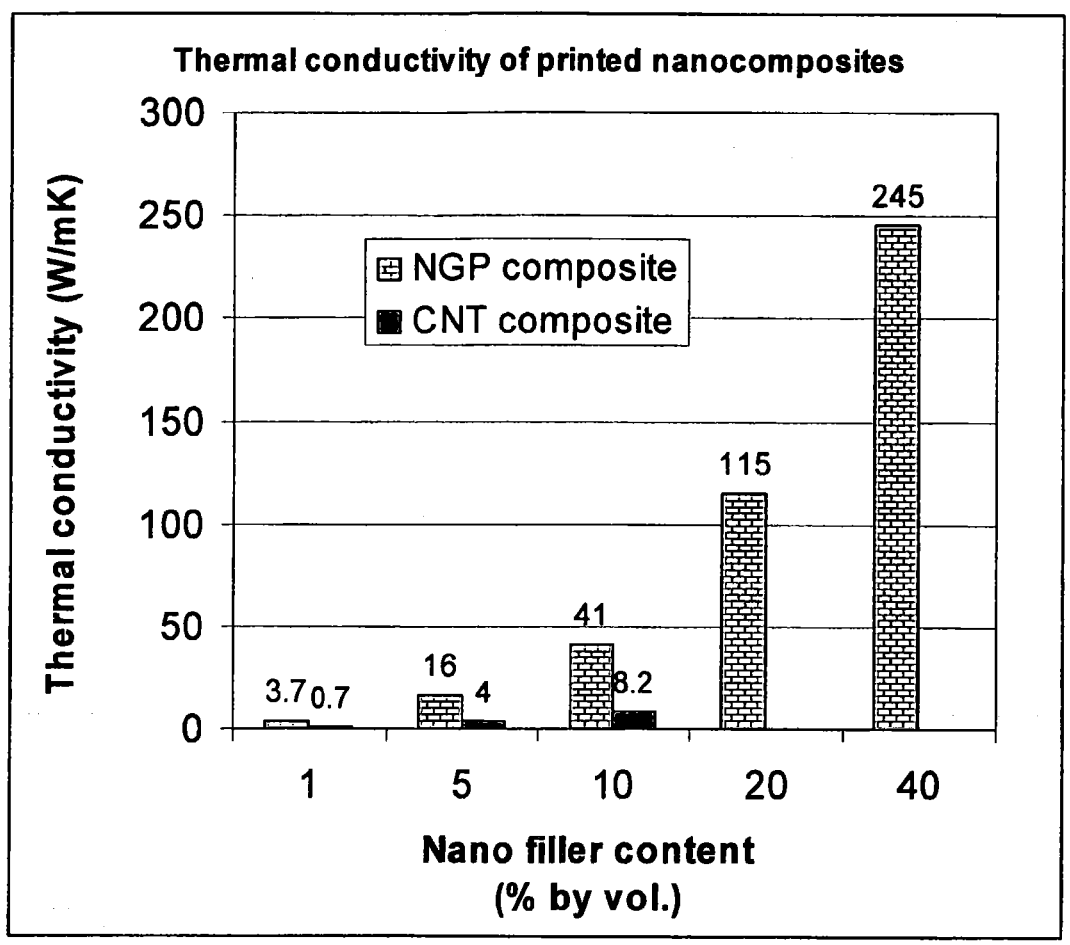
FIG. 4: Thermal conductivity data for NGP- and CNT-based nanocomposites deposited on a solid substrate via inkjet printing.

In order to evaluate the thermal conductivity of NGP-polymer and CNT-polymer nanocomposites obtained by inkjet printing, a series of PEDOT-PSS/CNT and PEDOT-PSS/NGP dispersions were prepared in a way similar to the procedure as described above, but the polymer-to-filler ratio was varied to obtain various diluted inks that are inkjet printable. The inks led to printed nanocomposites with various CNT or NGP contents. It may be noted that the NGPs used in this examples have an average thickness of approximately 1 nm, containing one or few graphene planes per platelet. They have exhibited exceptionally high thermal conductivity. The thermal conductivity data for these printed nanocomposites are summarized in FIG. 4. It is clear that NGP-based nanocomposites produced from inkjet printing of corresponding conductive inks are superior to CNT nanocomposites in terms of thermal conductivity enhancement. Furthermore, the absolute thermal conductivity values of NGP-polymer composites reach 16 W/(mK) with only 5% NGPs. This thermal conductivity value is significantly higher than the best value thus far reported in the literature (e.g., 7 W/(mK) for 25% NGP-epoxy composite reported by Yu, et al. [Ref. 17]). With 40% of the un-oxidized NGPs, the nanocomposite exhibits an impressive thermal conductivity of 245 W/(mK).

Hence, a preferred embodiment of the present invention is a nano graphene platelet-based conductive ink that is printable, comprising: (a) nano graphene platelets that have an average thickness no greater than 10 nm (preferably no greater than 1 nm), and (b) a liquid medium in which these nano graphene platelets are dispersed, wherein the nano graphene platelets occupy a proportion of at least 0.001% (preferably at least 1%, more preferably at least 3%) by volume based on the total ink volume.

To meet the requirements of high electrical and thermal conductivity, it has proven essential to prepare inks from non-oxidized or pristine NGPs. Hence, another highly preferred embodiment of the present invention is a nano graphene platelet-based conductive ink that is printable, comprising: (a) non-oxidized or pristine nano graphene platelets, and (b) a liquid medium in which these nano graphene platelets are dispersed, wherein the nano graphene platelets occupy a proportion of at least 0.001% by volume based on the total ink volume (preferably at least 1%, more preferably at least 3%). Again, the inks containing high NGP loadings (e.g., >40% by volume), albeit not inkjet printable using a current inkjet printhead, can be applied or deposited using techniques such as screen printing.

The features and benefits of NGP-based conductive inks include the following:

(1) NGPs are much less expensive than nano silver particles (e.g., for RFID antenna application) and carbon nano-tubes (CNTs).

(2) NGP-based nanocomposites are capable of readily forming a thin film, paper, or coating for electromagnetic interference (EMI) shielding and electrostatic charge dissipation (ESD) applications.

(3) Due to the ultra-high thermal conductivity of NGPs (5 times more thermally conductive, yet 4 times lower in density compared to copper), a nanocomposite thin film, paper, or coating can be used as a thermal management layer in a densely-packed microelectronic device.

(4) A high loading of NGPs (up to 75% by wt.) can be incorporated into a polymer matrix, as opposed to up to only 5-10% of CNTs. Both CNTs and CNFs (carbon nano-fibers) have dispersion issues which derive from a high length-to-diameter aspect ratio. CNTs require overcoming van der Waals forces, while both CNTs and their larger-diameter cousins (CNFs) can easily get entangled with one another, or "bird-nested" into bundles which must be dispersed to optimize efficacy in many applications. Hence, the loading of these conductive nano-fillers increases the viscosity of the matrix resin to a level that is not conducive to composite processing or inkjet printing. This is not the case for the NGP-resin systems, wherein the two-dimensional platelets can slide over one another, leading to low resistance to shear flow even at a relatively high NGP proportion. This feature would enable easier application of inks/coatings (e.g., easier inkjet printing of an NGP-containing solution) and more convenient melt processing of polymer nanocomposites containing a high NGP loading.

(5) For thermal management applications, the anisotropic properties NGPs allow them to move heat directionally, enabling control of the heat transfer. These unique materials have an in-plane two-dimensional thermal conductivity that can be tailored to up to 5,300 W/mK and a through-thickness third dimension conductivity of several W/mK. Competition materials, such as aluminum and copper, move heat in all directions, but due to high contact resistance, they do not transfer heat from components efficiently. Further, NGP-based thermal interface materials (TIM) can be easily cut and molded into intricate shapes, sizes and thickness. More importantly, NGP-TIM can be printed onto solid substrates that have intricate surface profiles or difficult-to-reach spots in a microelectronic device. In addition, NGPs can be combined with plastics, metals or elastomers in finished components.

What is claimed:

1. A process for forming a printed electronic component or thermally or electrically conductive pattern on a substrate comprising the steps of: applying to a substrate by printing in the form of a thermally or electrically conductive pattern or electronic component, an ink composition including (a) nano graphene platelets wherein each of the platelets comprises a graphene sheet or multiple graphene sheets that are un-oxidized or pristine graphene and the platelets have a thickness no greater than 100 nm, and (b) a liquid medium in which said nano graphene platelets are dispersed, wherein said nano graphene platelets occupy a proportion of at least 0.001% by volume based on the total ink volume, to the surface of a substrate.

2. The process of claim 1 wherein the step of applying to a substrate by printing is performed by brush painting, syringe application, inkjet printing, screen printing, gas assisted spraying, or a combination thereof.

3. The process of claim 1 wherein the step of applying to a substrate by printing is performed by inkjet printing or screen printing.

4. The process of claim 3 wherein the pattern is a printed electronic component.

5. The process of claim 4 wherein the graphene platelets have an average thickness less than 10 nm.

6. The process as set forth in claim 5 wherein the nano graphene platelets contain single-layer graphene.

7. The process as set forth in claim 5 wherein the ink composition further comprising a surfactant and/or a binder material.

8. The process as set forth in claim 7 wherein the ink composition further comprising a binder or matrix material selected from a thermoplastic, a thermoset resin, a conductive organic substance, a petroleum or coal tar pitch, or a combination thereof.

9. A process for forming a printed electronic component or thermally or electrically conductive pattern on a substrate comprising the steps of: applying to a substrate by printing in the form of a thermally or electrically conductive pattern or electronic component, an ink composition including (a) nano graphene platelets wherein each of the platelets comprises a graphene sheet or multiple graphene sheets that are un-oxidized or pristine graphene and the platelets have a thickness no greater than 100 nm, and (b) a liquid medium in which said nano graphene platelets are dispersed, wherein the graphene platelets occupy a proportion of at least 3% by volume based on the total ink volume, to the surface of a substrate.

10. The process as set forth in claim 9 wherein a viscosity is less than about 500 mPaS.

11. The process as set forth in claim 10 wherein a viscosity is less than about 200 mPaS and said printing ink contains no less than 20% by volume of nano graphene platelets.

12. The process as set forth in claim 11 wherein said printing ink, after printing onto a solid substrate to form a solid component or pattern provides a thermal conductivity of 100 W/(mK).

13. A process for forming a printed electronic component or thermally or electrically conductive pattern on a substrate comprising the steps of: applying to a substrate by printing in the form of a thermally or electrically conductive pattern or electronic component, an ink composition including (a) nano graphene platelets wherein each of the platelets comprises a graphene sheet or multiple graphene sheets that are un-oxidized or pristine graphene and the platelets have a thickness no greater than 100 nm, (b) carbon nanotubes of up to 5% by volume, and (c) a liquid medium in which said nano graphene platelets are dispersed, wherein said nano graphene platelets occupy a proportion of at least 0.001% by volume based on the total ink volume, to the surface of a substrate.

14. The process of claim 13 wherein the step of applying to a substrate by printing is performed by brush painting, syringe application, inkjet printing, screen printing, gas assisted spraying, or a combination thereof.

15. The process of claim 13 wherein the step of applying to a substrate by printing is performed by inkjet printing or screen printing.

16. The process of claim 13 wherein the graphene platelets have an average thickness less than 10 nm.

17. The process as set forth in claim 13 wherein the ink composition further comprising a surfactant and/or a binder material.

18. The process as set forth in claim 13 wherein the ink composition further comprising a binder or matrix material selected from a thermoplastic, a thermoset resin, a conductive organic substance, a petroleum or coal tar pitch, or a combination thereof.

19. The process as set forth in claim 13 wherein a viscosity of said ink composition is less than about 500 mPaS.

* * * * *